United States Patent [19]

Chang et al.

[11] Patent Number: 5,191,174
[45] Date of Patent: Mar. 2, 1993

[54] HIGH DENSITY CIRCUIT BOARD AND METHOD OF MAKING SAME

[75] Inventors: Chi S. Chang, Endicott; Joseph G. Hoffarth, Binghamton; Voya R. Markovich, Endwell; Keith A. Snyder; John P. Wiley, both of Vestal, all of N.Y.

[73] Assignee: International Business Machines Corporation, Armonk, N.Y.

[21] Appl. No.: 561,401

[22] Filed: Aug. 1, 1990

[51] Int. Cl.⁵ .............................................. H05K 1/00
[52] U.S. Cl. .................................. 174/266; 361/414; 29/830
[58] Field of Search ............... 174/266, 250, 262, 255; 29/830, 831; 361/414, 412, 410, 416

[56] References Cited

U.S. PATENT DOCUMENTS

| | | | |
|---|---|---|---|
| 3,436,819 | 4/1969 | Lunine | 361/414 |
| 3,516,156 | 6/1970 | Steranko | 361/414 X |
| 4,710,854 | 12/1987 | Yamada et al. | |
| 4,788,766 | 12/1988 | Burger et al. | |
| 4,803,450 | 2/1989 | Burgess | 29/830 |
| 4,967,314 | 10/1990 | Higgins, III | 361/410 |
| 5,012,047 | 4/1991 | Dohya | 361/414 X |

Primary Examiner—Leo P. Picard
Assistant Examiner—Trinidad Korka
Attorney, Agent, or Firm—Lawrence R. Fraley

[57] ABSTRACT

A multilayered circuit board assembly which includes a plurality of layered subassemblies each having electrically conducting wiring and at least one through hole therein. A first of these subassemblies possesses a greater wiring dnesity than the others while a second subassembly possesses a lesser resistance (and wiring density) than the others. In one example, several (e.g. at least four) such layered subassemblies may be included in the overall assembly such that those layers located along one side of the board may possess substantially greater wiring densities than the layers on the other side of the board while those layers on said other side will in turn possess lesser resistance (and greater current capacities). There are also described at least three methods for making the above multilayered circuit board assembly. Such a structure may be utilized in supercomputer applications.

21 Claims, 6 Drawing Sheets

HIGH DENSITY CIRCUIT BOARD AND METHOD OF MAKING SAME

TECHNICAL FIELD

The invention relates to printed circuit boards, and particularly those of the high density variety.

BACKGROUND

High density printed circuit boards are typically constructed of several electrically conductive layers separated by layers of dielectric material. Some of the conductive layers may be utilized as power and ground planes while other conductive layers may be patterned for electrical signal connections (e.g. between integrated circuit chips). Layer-to-layer interconnections may be used in such constructions and accomplished using what is referred to as plated-through-holes (PTH's), such holes typically including a plating of electrically conductive material (e.g., copper) therein. In those situations wherein electrical interconnections are desired between adjacent conducting layers, it has been common in the art to provide such connections with what are commonly referred to as "vias". These hole type connections, though typically not extending through the entirety of the board's thickness, are also coated (e.g., plated) with an internal conductive layer (e.g., copper). Such "vias" and through-holes are typically provided by drilling.

Examples of various types of multilayer printed circuit board constructions are defined in U.S. Pat. Nos. 4,030,190 (K. Varker), U.S. Pat. No. 4,554,405 (K. Varker), U.S. Pat. No. 4,854,038 (J. Wiley), U.S. Pat. No. 4,864,772 (D. Lazzarini et al) and U.S. Pat. No. 4,868,350 (J. Hoffarth et al). All of these patents are assigned to the same assignee as the instant invention.

As defined in the above and other patents, and as is also well known in the art, such multilayered printed circuit board constructions typically utilize copper or a similar highly conductive material for the signal and/or power and/or ground conductive planes. One well known example of a dielectric material for use in such constructions is epoxy glass. Other materials may include polyimide and polytetrafluoroethylene (e.g., Teflon, a trademark of E.I. du Pont de Nemours and Company), the latter of more recent vintage when relatively low dielectric materials are desired.

As will be defined herein, the present invention comprises a multilayered circuit board construction comprised of individual layered subassemblies each including electrically conducting wiring and at least one through-hole therein. The resulting multlilayered structure as defined herein is characterized by the provision of a first one of these layers possessing a substantially high wiring density and at least one other layer possessing a substantially lesser current resistance in comparison to the other layers in the structure. By the term wiring density as used herein is meant to define the number of linear inches of conductive wiring per square inch of area per individual layer within each subassembly. These wiring conductors may be used for signal conducting, power and/or ground functions, depending on operational requirements. Thus, a layered subassembly having one conductive layer with four separate and spaced conductive lines each of one inch length and all located in a one inch square total area would possess a wiring density of 4.0 in/in$^2$.

By the term resistance as used herein is meant to define the amount of electrical resistance encountered by the electrical current passing through the individual conductive wiring in each layered subassembly. In the above example, this would be the amount of resistance (in ohms per inch) of the four lines of circuitry in the subassembly.

Use of layered subassemblies in an overall structure wherein selected ones of such subassemblies possess a substantially greater wiring density than other subassemblies while said other subassemblies possess significantly less resistance to current passing therethrough (and corresponding reduced wiring density) results in a multilayered structure of substantial versatility. Such a structure may include several (e.g., ten) individual layers as part thereof with those on one side of the board possessing relatively high wiring densities (and corresponding relatively low current capacity) while those of the other side of the board possess less resistance to the currents which flow therethrough but which also possess relatively low wiring densities. Such a structure is particularly useful when maximum input (e.g., signals) is desired to one side of the board and much greater current flow is desired within the other side. In this other side, such greater current flow (and associated lesser resistance), e.g., as provided by substantially larger (e.g., thicker) conductive wiring which may be spaced apart at greater distances than the smaller and more closely spaced conductive wiring in the side of the board possessing the aforedefined greater densities, enables not only the opportunity for greater current capacities than said other side but also for longer wiring paths between desired connections. Such a structure is considered particularly useful in supercomputer environments.

Accordingly, it is believed that a multilayered circuit board assembly possessing the above advantageous features would constitute a significant advancement in the art.

DISCLOSURE OF THE INVENTION

It is, therefore, a primary object of the present invention to enhance the art of multilayered circuit boards.

It is another object of the present invention to provide a multilayered circuit board assembly wherein selected layers of the assembly possess substantially greater wiring density than other layers while said other layers possess substantially lesser resistance.

It is a further object of the invention to provide a method of making such a multilayered structure.

In accordance with one aspect of the invention, there is defined a multilayered circuit board assembly which includes first and second layered subassemblies each having electrically conducting wiring and at least one through-hole therein. The first layered subassembly possesses a greater wiring density than the second and the second layered subassembly possesses a lesser electrical resistance than the first. This assembly may include several such layered subassemblies, in which case, additional layers located between the first and second would contain progressively lesser wiring densities than the first layer with corresponding lesser resistances as such layers approach the second layer.

In accordance with another aspect of the invention, there is defined a method of making a multilayered circuit board assembly which includes a plurality of layered subassemblies each having electrically conductive wiring and at least one through-hole therein. The method comprises the steps of providing a first of these layered subassemblies, aligning a second of these subassemblies relative to the first, providing at least one through-hole in the second subassembly which also extends through the first subassembly, and providing a layer of conductive material within the through hole which extends through both first and second subassemblies such that the first subassembly will possess a greater wiring density than the second while the second will possess a lesser resistance than the first.

In accordance with still another aspect of the invention, there is defined a method of making a multilayered circuit board assembly which includes a plurality of layered subassemblies each having electrically conducting wiring and at least one through-hole therein. This method comprises the steps of providing at least one of the through-holes in each of the subassemblies, positioning the subassemblies relative to each other such that each through-hole aligns with a respective through-hole in each of the other subassemblies, bonding the layered subassemblies having said aligned through-holes together to form a multilayered structure, and providing a continuous conductive layer within each of the aligned through-holes such that a first of the layered subassemblies possesses a wiring density greater than the other subassemblies and a resistance greater than the other subassemblies while another of the other layered subassemblies possesses a wiring density and a resistance less than the others of the layered subassemblies, including the first.

BEST MODE FOR CARRYING OUT THE INVENTION

For a better understanding of the present invention, together with other and further objects, advantages and capabilities thereof, reference is made to the following disclosure and appended claims in connection with the above-described drawings.

The following disclosure and associated drawings define three separate processes for making a multilayered circuit board assembly possessing the unique characteristics as defined herein. As understood, this final assembly will include a plurality of layered subassemblies joined together in a predetermined manner such that respective ones of these will possess the operational characteristics (wiring density, resistance) defined.

Figure 1:
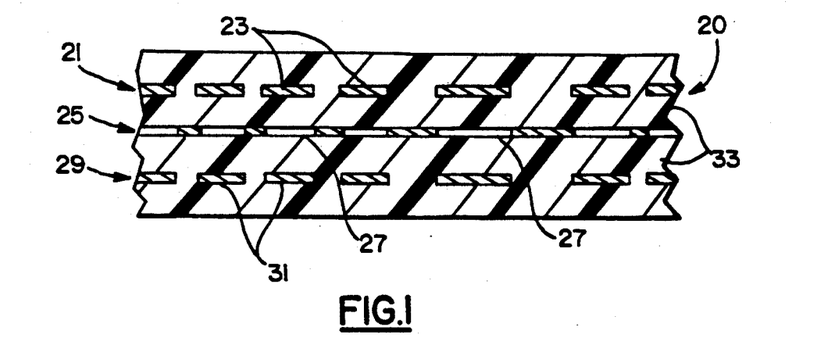
FIGS. 1-5 represents a method of making a multilayered circuit board in accordance with one embodiment of the invention, the final structure for said board being illustrated in FIG. 5.

In FIGS. 1-5, there are shown the various steps of making a multilayered circuit board assembly in accordance with one embodiment of the invention. FIG. 1 represents one example of a layered subassembly 20 capable of being combined with other layered subassemblies to form the circuit board of the invention. It is to be understood that the configuration depicted in FIG. 1 is representative of only one version of such subassemblies and the invention is thus not limited thereto. That is, the structure as illustrated in FIG. 1 and as will be defined below includes at least three electrically conductive planes therein, each surrounded by appropriate dielectric material. In the simplest form of the invention, however, it is to be understood that a layered subassembly as used herein may only include a singular dielectric layer and attached or internally contained singular conductive layer. By the term conductive layer as used herein is meant to include a singular layer of electrically conductive material (the preferred material being copper), said layer capable of functioning as a signal, power or ground layer, or combinations thereof. Said layer, preferably planar (as conductors (e.g., wiring) and/or a substantially solid (but containing apertures therein) sheet of conductive material (e.g., copper), or combinations thereof.

The layered subassembly 20 in FIG. 1 preferably includes a first conductive layer 21 (e.g., a signal layer comprised of several individual conductive wires 23 spacedly located adjacent one another), a second electrically conductive layer 25 (e.g., a power plane or layer formed, e.g., of a substantially solid sheet of copper with apertures 27 formed at preselected locations therein) and a third conductive layer 29 located opposite the power plane 25 from the first layer 21. This third conductive layer 29 may also constitute a signal layer comprised of several individual, spaced wiring 31. As stated above, the layers 21, 25 and 29 have been defined as conductive layers, meaning that each is capable of conducting electrical current in a specified manner. Each of these layers may also be referred to herein as conductive wiring, a term also used extensively in the art.

Layered subassembly 20 further includes dielectric material 33 which, in a preferred embodiment, surrounds the three layers of conductive wiring. A preferred dielectric material for use in this particular subassembly is epoxy glass, a known epoxy resin formula having glass fiber therein. Alternative materials may include polyimide and polytetrafluoroethylene (e.g., Teflon), both known to be used in the manufacture of circuit board members.

Although dielectric material 33 is shown as being located along the external surfaces (upper and lower in FIG. 1), it is understood that this is not necessary in that the respective wiring layers 21 and 29 may form the outermost layers in this arrangement. Positioning of dielectric along the outermost surfaces is preferred, however, as will be understood from the following description.

Other examples of layered subassemblies suitable for use in the invention may include those including an interim dielectric layer having separate layers of conductive wiring on the outer surfaces thereof. Such a structure will thus include only two such layers of conductive wiring, with one preferably serving as a signal layer and the other as a power layer. Further, other combinations are also within the scope of the invention. It is to be understood that in the broadest aspect of the invention, each layered subassembly for use in the invention need only include a singular layer of dielectric and accompanying singular layer of conductive wiring.

In one example of the invention, a layered subassembly 20 having copper conductive wiring therein was produced wherein each wiring layer possessed a thickness within the range of about 0.00035 inch to about 0.0028 inch. These layers may be spaced apart a distance of about 0.004 to about 0.010 inch. The subassembly 20 as so produced possessed an overall thickness of about 0.010 inch.

It is to be understood that the layered subassembly 20 as described above may form one or more of the layered subassemblies for use in each of the three methods described below. It is also within the scope of the invention to combine this layered subassembly with other subassemblies of different configuration, e.g., those described above. techniques, several of which are known in the art. Further description is thus not believed necessary.

Figure 2:
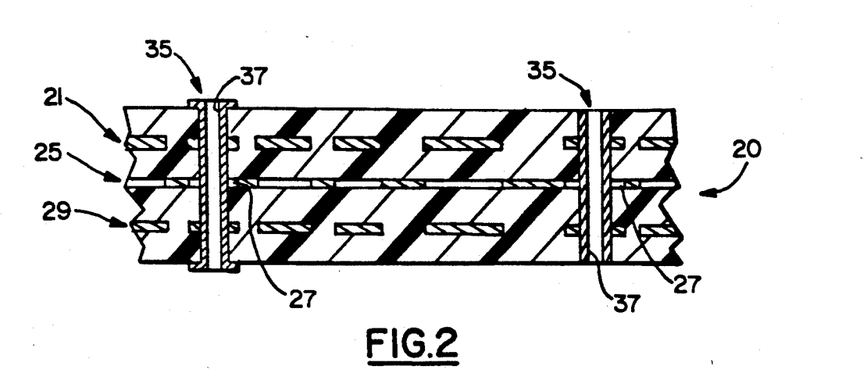

In FIG. 2, layered subassembly 20 has been provided with a plurality of through-holes, each preferably including a layer of conductive material (e.g., copper) 37 therein. These through-holes, also referred to in the art as plated-through-holes, serve to electrically interconnect the respective layers of conductive wiring 21 and 29. Connection is not provided to the centrally disposed conductive wiring 25, the through-holes 35 passing through the provided apertures (27) therein. Such connection is possible at these locations, however, if desired (e.g., for power distribution). It is within the scope of the invention to further extend the conductive layers for these through-holes to the external (upper and lower) surfaces of subassembly 20, e.g., to connect to other conductive elements. A representative example of such a through-hole construction as illustrated by the through-hole 35 to the left in FIG. 2.

With the necessary connections made to the respective layers of conductive wiring, the layered subassembly 20 in FIG. 2 is then subjected to testing (e.g., continuity and shorts).

Figure 3:
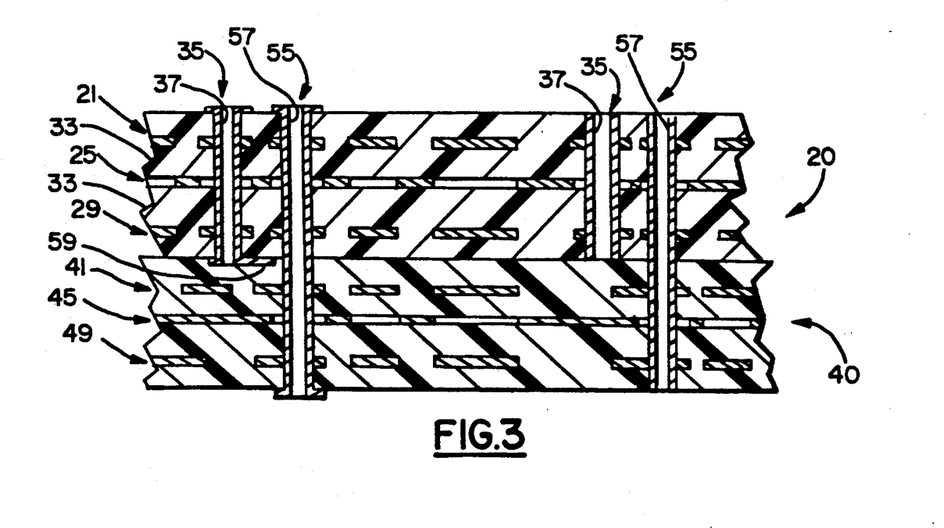

In FIG. 3, layered subassembly 20 is shown as being aligned with a second layered subassembly 40. Subassembly 40, like subassembly 20, includes three separate layers of conductive wiring 41, 45 and 49 therein. Of these, wiring 41 and 49 preferably serve as signal planes while interim layer of wiring 45 provides necessary power connections. Significantly, second subassembly 40 possesses lesser wiring density than subassembly 20, but, equally significant, possesses a lesser resistance (and greater current capacity) than subassembly 20. By way of example, subassembly 20 may include a wiring density of about 500 inch/inch$^2$ and current resistance of about 1.7 ohms/inch, while the second subassembly 40 possesses a wiring density of 250 inch/inch$^2$ and corresponding resistance of 0.7 ohms/inch. It is also possible, in order to achieve this, to employ wiring for second subassembly 40 that is somewhat thicker and/or wider (and spaced apart at greater distances) than that of first subassembly 20.

With both subassemblies aligned (and tested), these are now bonded, e.g., using normal lamination techniques. For example, both subassemblies may be aligned using external means (peripheral apertures within each which are positioned on common aligning pin structures) and both subassemblies then subjected to laminating pressures (e.g., 300–500 pounds per square inch (PSI)) and elevated temperatures (e.g., 180 degrees Celsius (C)). Once both subassemblies are bonded, through-holes 55 are provided through the composite structure to provide desired interconnections between designated layers of conductive wiring. In the example illustrated in FIG. 3, the individual signal planes (21, 29, 41 and 49) may be connected. Each through-hole, as with through-holes 35, includes a common layer of conductive material (e.g., copper) 57 therein. This material may extend to the external surfaces of the composite, as represented by the through-hole 55 to the left in FIG. 3. It is further noted that the through-hole 35 in subassembly 20 wherein such conductive material was extended may be electrically coupled to a conductive wiring member (59) which in turn may be formed on/­within the upper surface of the lower subassembly 40, thus even further expanding the operational capabilities of this composite.

Figure 4:
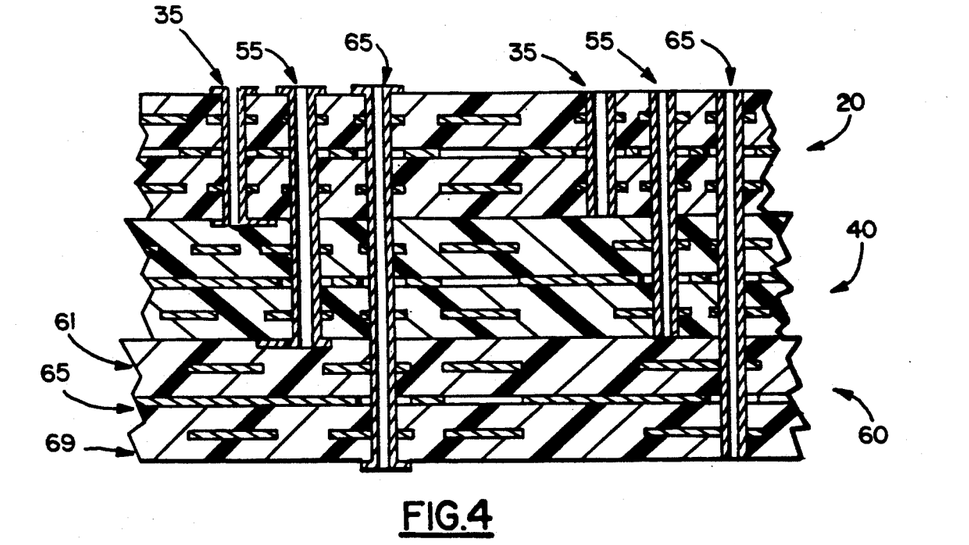
Figure 5:
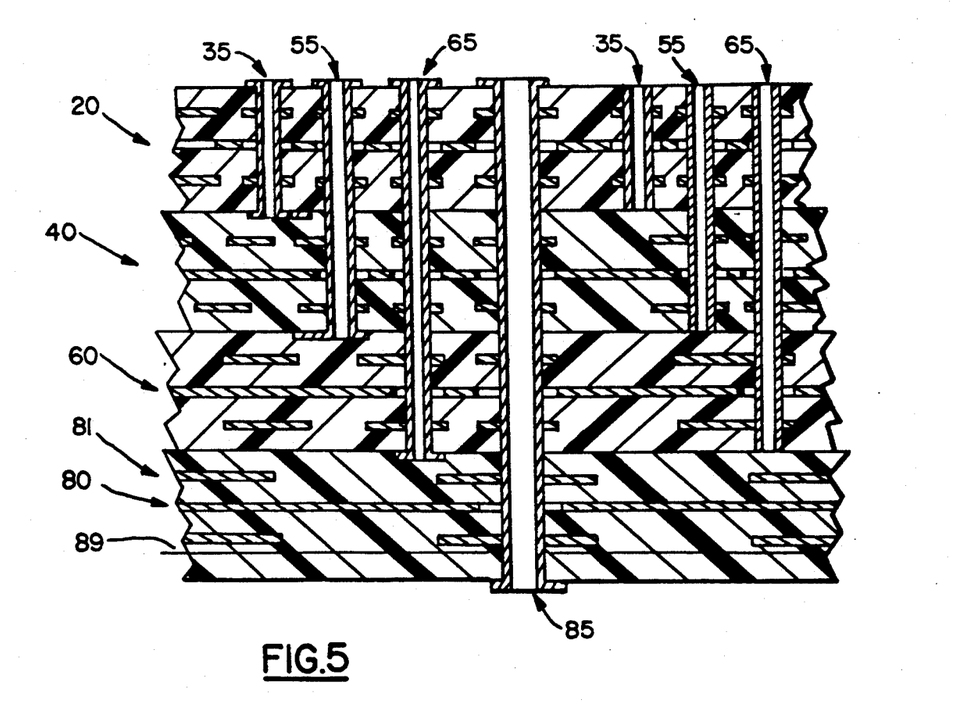

The composite structure as illustrated in FIG. 3 represents a multilayered circuit board assembly in its simplest form as may be produced in accordance with the teachings herein. That is, such an assembly may include only two layered subassemblies in order to provide the described operational characteristics (wiring densities and current capacities). The invention is not limited, however, to only use of two such subassemblies, as it may be desirable (and usually is) to provide a circuit board assembly with greater operational capability. Thus, as shown in FIGS. 4 and 5, additional layered subassemblies (60, 80) may be added. Each additional subassembly will preferably possess a wiring density less than its predecessors and a lesser resistance capacity. Additionally, a common through-hole (65 in FIG. 4, 85 in FIG. 5) is then added to provide desired interconnections between respective layers of conductive wiring. Although only one such through-hole is depicted in FIG. 5 for the entire composite, it is of course understood that several others may be used and in fact are most likely desired. By way of example, a total composite structure of four layered subassemblies such as depicted in FIG. 5 may include a total of within the range of from about 10,000 to about 100,000 through-holes 35 in the first subassembly 20, from about 5,000 to about 50,000 through-holes 55 in subassembly 40, from about 2500 to about 25000 through-holes 65 in subassembly 60 and from about 1250 to about 12500 through holes 85 in subassembly 80. Although the structure as depicted in FIG. 5 is shown to include through-holes with conductive layers adapted for interconnecting only the illustrated layers of conductive signal wires (21, 29, 41, 49, 61, 69, 81 and 89), this is not meant to limit the invention. For example, connections can instead be made directly to the power or ground layers of conductive wiring, to alternative ones of said layers, etc. Further, the through-holes as shown in the final composite structure of FIG. 5 may be of different size (diameters), depending on the interconnections desired. For example, through-hole 85 may have a diameter significantly larger than the shorter depth through-hole 35.

Additionally, the conductive layers used on each of the through-holes may have different thicknesses, again depending on the connections made. As in the situation between layered subassemblies 20 and 40, the subsequent subassemblies 60 and 80 may include conductive wiring which is greater in width and/or thickness and­/or spacings than corresponding wiring in the prior subassemblies. Such will further assure the lesser resistances desired for these respective layers.

There has thus been described a method of making a multilayered circuit board assembly which in turn comprises a plurality of individual layered subassemblies. The resulting structure possesses substantially greater wiring density at one side portion thereof and a much lesser resistance (and corresponding greater current capacity) at the other side. Such is considered highly desirable in some high density circuit structures, e.g. those for use in supercomputers. In one example, a multilayered board assembly having wiring densities ranging from about 250 inch/inch$^2$ to about 2000 inch/inch$^2$ therein was provided, this assembly in turn including corresponding electrical resistances within the range of about 0.11 ohms/inch to about 1.32 ohms/inch. Of significant advantage, the methods as defined enables individual testing of each subassembly prior to its incorporation within the final composite. Significant cost savings (from reduced scrap) is thus realized over structures which only allowed for testing once final assembly thereof was achieved.

In FIGS. 6–11 there is shown another method of making a multilayered circuit board assembly of the invention.

Figure 6:
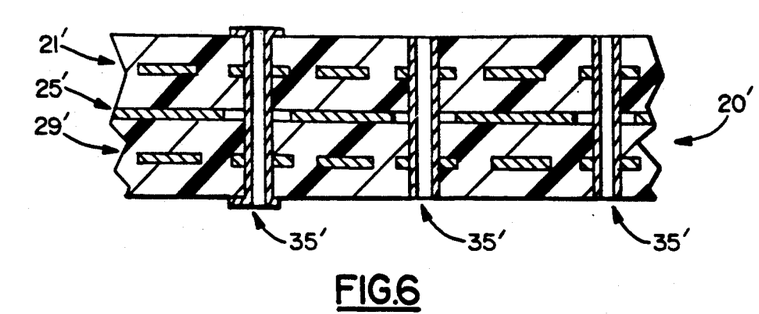
FIGS. 6-11 illustrate another method of making a multilayered circuit board in accordance with another embodiment of the invention, the finalized structure for this assembly being depicted in FIG. 11.

In FIG. 6, a layered subassembly 20' is produced possessing a substantially similar configuration to that of subassembly 20 in FIG. 1. In this layered subassembly is provided a plurality of through-holes 35' using known in the art (drilling). These through-holes are each preferably of a first diameter (e.g. from about 0.002 inch to about 0.006 inch) and include a layer of conductive material (e.g., copper) therein to provide the desired interconnections similarly to those in layered subassembly 20.

Figure 7:
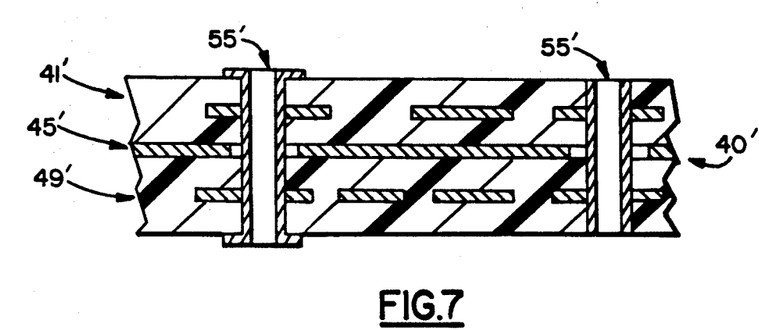

In the next step, as shown in FIG. 7, a second layered subassembly 40' is produced, this subassembly also preferably comprising three layers of electrically conducting wiring 41', 45' and 49' which, as in subassembly 20' may comprise signal, power and/or ground functions. In this arrangement, however, the respective wiring for these layers is of lesser wiring density than that in the first subassembly 20', while the second subassembly 40' possesses a lesser resistance. Accordingly, the wiring for these layers may be of greater thickness and/or width than those in the first subassembly. Significantly, through-holes 55' are provided in second subassembly 40' at this time (prior to bonding to the first subassembly). Of further significance, these second through-holes 55' possess a greater outer diameter than those in the first subassembly 20'. By way of example, holes 55' having diameters of about 0.004 inch to about 0.010 inch may be used.

Figure 8:
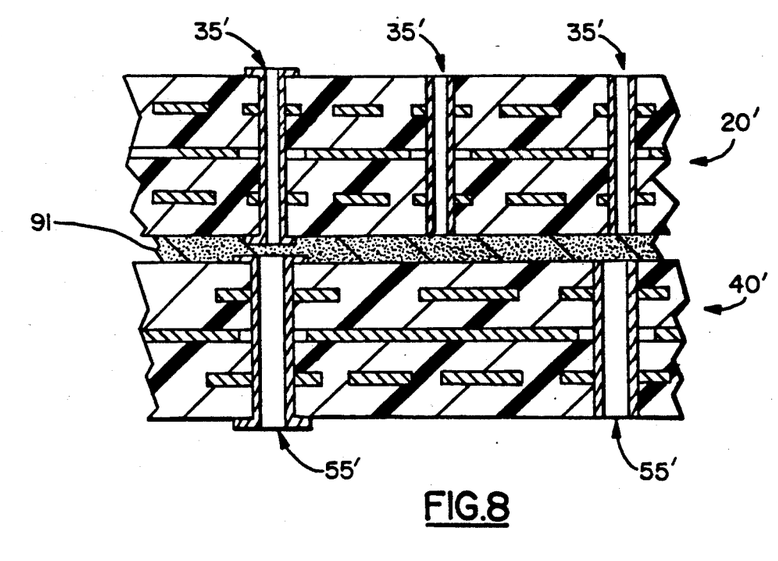

In FIG. 8, both layered subassemblies 20' and 40' have been aligned such that respective through-holes of each are also aligned relative to each other. An interim layer of known adhesive material (e.g., prepreg) 91 is used as the bonding agent. Both layered subassemblies are then bonded, preferably using lamination techniques, several of which are known in the art. By way of example, both subassemblies can be subjected to pressures within the range of from about 300 to 500 pounds per square inch at temperatures of about 180° C. Bonding thus occurs.

Figure 9:
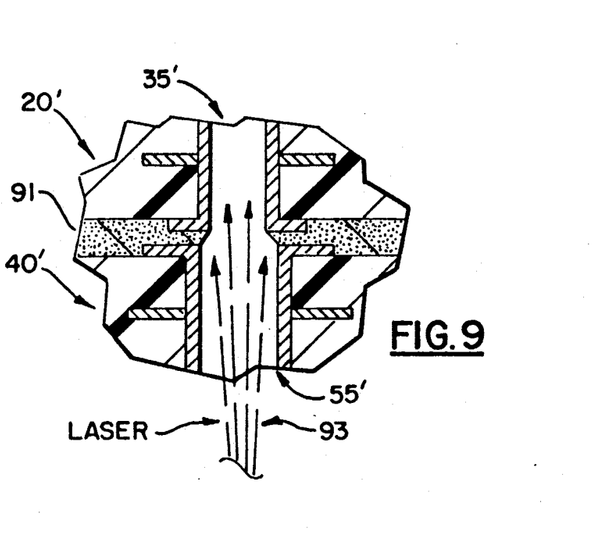
Figure 10:
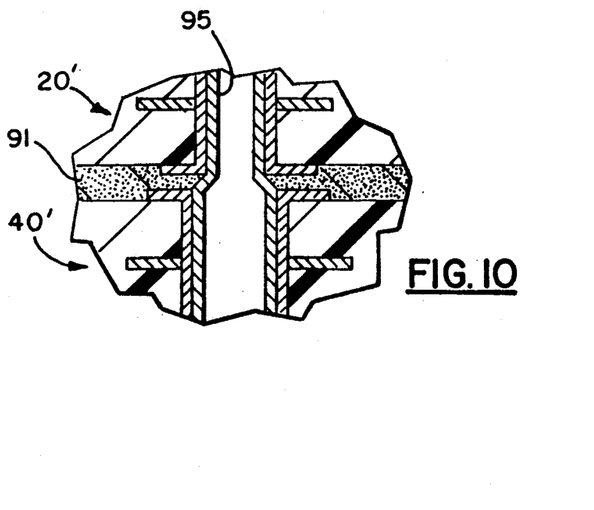

In order to assure positive electrical interconnection at the interim location of the aligned through-holes, it is thus necessary to remove the portions of dielectric 91 thereat. In one example of the invention, this is preferably achieved through laser ablation wherein a laser beam 93 is directed from the side of the composite structure having the larger diameter through-holes therein. Removal of dielectric 91 is thus achieved, as shown in FIG. 9, following which a secondary layer of conductive material (copper) 95 is added (e.g. by plating).

Figure 11:
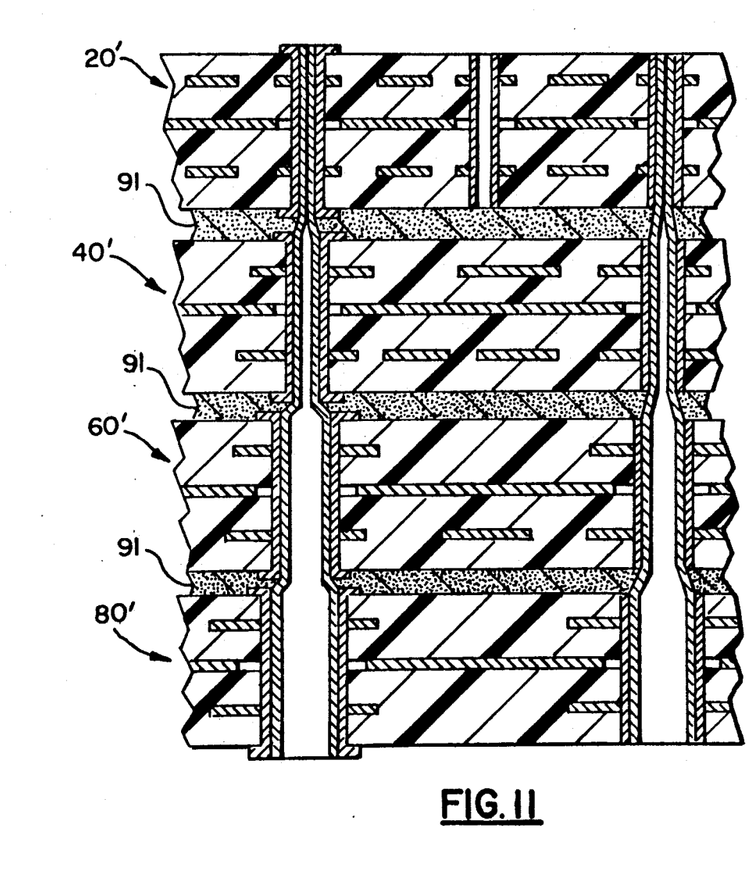

If additional layered subassemblies (e.g., 60' and 80') are desired, these may also be provided with corresponding larger through-holes therein and aligned with the predecessor subassemblies, e.g. as shown in FIG. 11. Dielectric adhesive 91 is used between each subassembly and the entire, aligned structure is then bonded (e.g. using lamination as above). Preferably, this composite is bonded in such a manner prior to dielectric removal at the aligned through hole interconnections such that this removal step (e.g., laser ablation) may be performed only once for the entire, multilayered composite. The corresponding layer of conductive copper may then be added to the aligned holes of this structure using known techniques (e.g., additive plating). As also shown in FIG. 11, the respective layers of conductive wiring for each of the subsequent subassemblies may be substantially larger in thickness and/or width and/or spacing in order to assure the lesser resistances desired. This resulting structure, like that in FIG. 5, thus assures substantially greater wiring densities at one side (the upper portion) of the structure and substantially lesser resistances (and greater current capacities) at the other, opposing side (lower portion). By way of example, such a structure as illustrated in FIG. 11 may include a first layered subassembly (20') with a wiring density of from about 500 inch/inch$^2$ to about 600 inch/inch$^2$ and corresponding resistance within the range of about 1.6 ohms/inch to about 2.4 ohms/inch, a second layered subassembly (40') having a wiring density from about 250 inch/inch$^2$ to about 300 inch/inch$^2$ and resistance from about 0.66 ohms/inch to about 1.0 ohms/inch, a third subassembly (60') having a wiring density from about 120 inch/inch$^2$ to about 150 inch/inch$^2$ and resistance from about 0.25 ohm/inch to about 0.4 ohms/inch and a fourth layered subassembly (80') having a wiring density from about 60 inch/inch$^2$ to about 75 inch/inch$^2$ and resistance from about 0.11 ohms/inch to about 0.15 ohms/inch. Such an overall structure may possess an overall thickness within the range from about 0.20 inch to about 0.50 inch. As in the embodiment of FIGS. 1–5, each layered subassembly is fully capable of being independently tested prior to final incorporation within the composite structure. Accordingly, cost savings are also realized using this unique approach.

Figure 14:
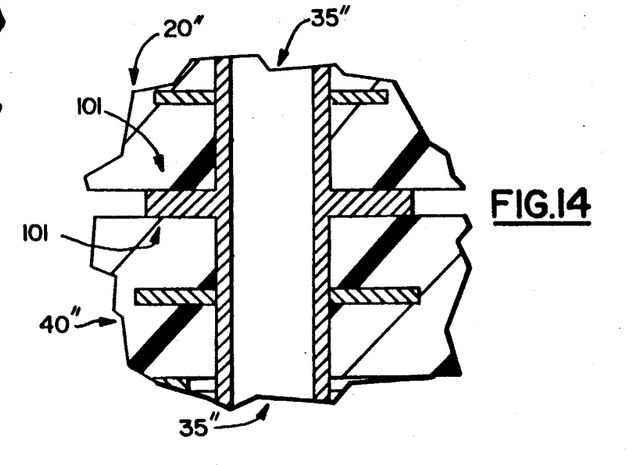
Figure 15:
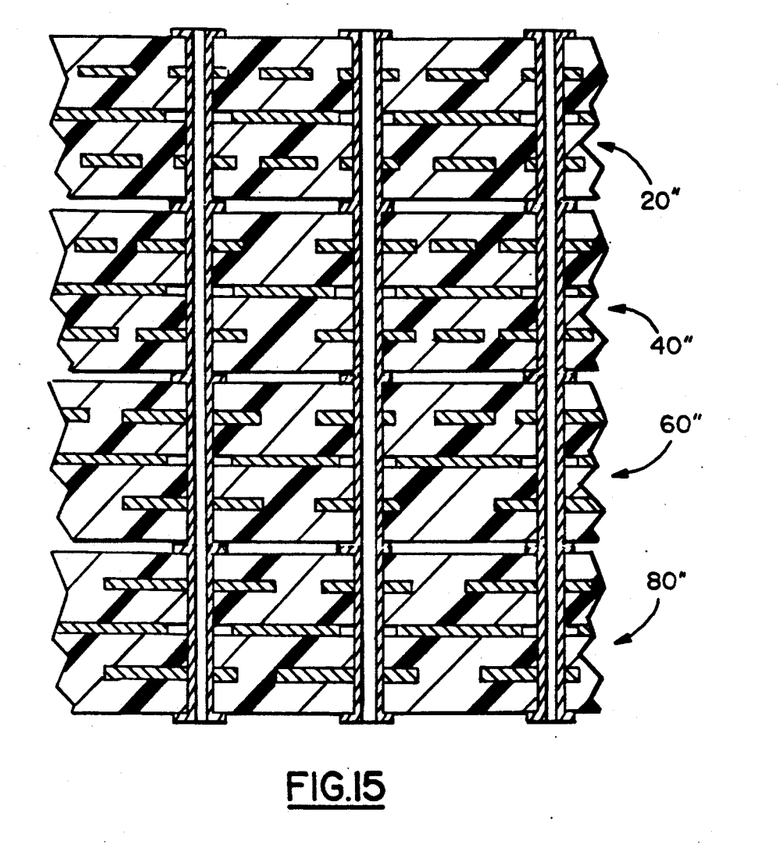

In FIGS. 12–15, there is shown yet another method of making a multilayered circuit board assembly for the invention. In this method, a plurality of layered subassemblies, each including a plurality of through-holes therein, are independently formed and subsequently aligned (e.g. using external alignment means such as described above) such that through-holes in each of these subassemblies are aligned with respective other through-holes to form a composite having aligned holes such as illustrated in FIG. 15. In simplest form, however, only two such layered subassemblies (20", 40" in FIG. 12) are necessary. Each layered subassembly possesses the appropriate wiring density and resistances (e.g. such as for those in FIGS. 1–5).

Figure 12:
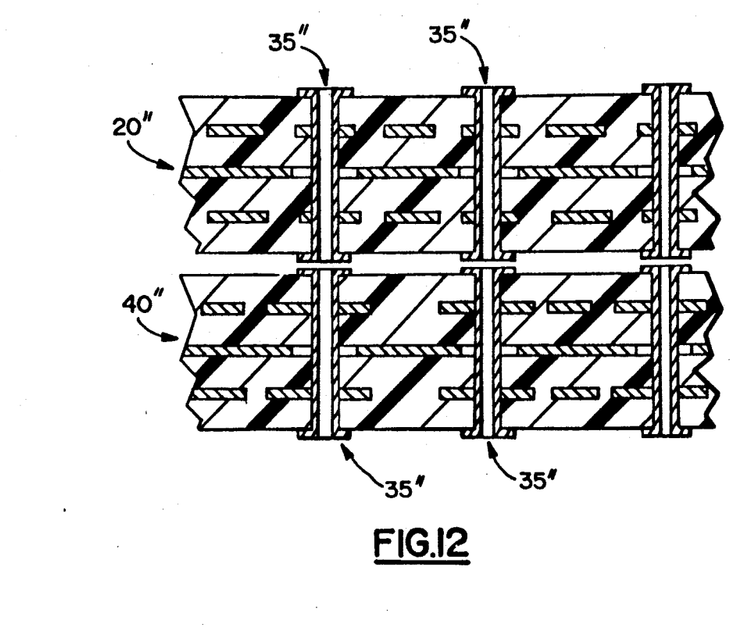
FIGS. 12-15 illustrate yet another method of making a multilayered circuit board in accordance with another embodiment of the invention, the final version of this multilayered assembly being depicted in FIG. 15.
Figure 13:
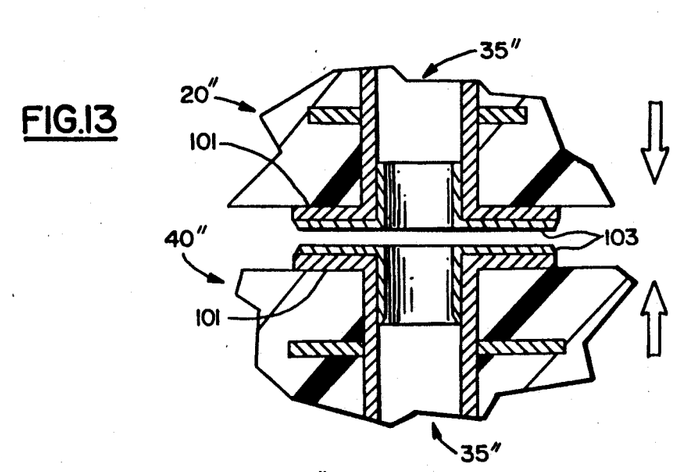

In FIG. 12, two such layered subassemblies 20" and 40" are aligned in order that the through-holes through each (35' ') are aligned. Such alignment is better depicted in the enlarged view of FIG. 13. Significantly, each through-hole includes an extending portion of conductive material (copper) 101 which extends from each layered subassembly and occupies a selected area on the outer surface thereof. These extension portions, or "lands", 101 each thus constitute a thin layer of copper material designed for aligning with a corresponding similarly sized element on the adjacent subassembly. Although the through holes 35" are shown in each aligned subassembly as being substantially similar in diameter, it is of course within the scope of the invention to provide holes in one of these subassemblies that are slightly larger in size, e.g., so as to produce a final structure similarly in shape and configuration to that in FIG. 11.

A thin layer of tin is then coated onto these extending portions 101 and slightly inwardly of each through hole 35" to a described depth (e.g., 0.00015 inch). Pressure (e.g., from about 300 PSI to about 500 PSI) is then applied to the aligned subassemblies while simultaneously subjecting these members to elevated temperatures (e.g., from about 250 degrees C. to about 300 degrees C.). At such pressures and temperatures, the tin layer 103 becomes molten and, due to the pressures applied, diffuses into the copper of the extending land areas 101 to form a substantially solid structure as illustrated in FIG. 14. Such diffusion is represented illustratively in FIG. 14 by the removal of demarcation lines or the like between the abutting land areas 101, such abutting structure thus now represented as a homogenous structure.

Use of the above materials, pressures and temperatures uniquely allows for individual alignment between the respective subassemblies (e.g., in the event that different land heights occur). That is, the resulting tin melting for each of these paired elements provides compensation for different thicknesses of the respective individual elements as used therein in their initial stage.

In the embodiment of FIG. 15, four layered subassemblies have thus been bonded to form the composite structure thereof. These subsequent layered subassemblies are represented by the numerals 60" and 80", each including, preferably, the three conductive wiring layers similar to those in the previous embodiments (though possibly of greater thicknesses and/or widths and/or spacings). A final structure possessing operational characteristics (wiring densities and resistances) similar to those described in the embodiments of FIGS. 1-11, is thus possible. Additionally, it is also possible to individually test each of these layered subassemblies prior to final bonding thereof. In this particular embodiment, however, it is not necessary to provide an additional conductive layer (copper) as was necessary in the embodiment of FIG. 11. A preferred dielectric material for each of the layered subassemblies used in this embodiment (FIG. 15) is polyimide or polytetrafluoroethylene (e.g., Teflon), a known polymer material. Such a material is preferred due to the relatively high temperatures and/or pressures to which the composite is subjected during final assembly.

Although the multilayered structure in FIG. 15 illustrates an equal number of through-holes in each of the layered subassemblies, it is understood that in a preferred embodiment, the number of through-holes per subassembly will vary and, most preferably, will progressively decrease in number from the upper, higher density layer (20") to the bottom, lesser density layer (80"). Such additional holes, resulting in a structure substantially similar to that depicted in FIG. 5, may be pre-drilled in each subassembly prior to the aforedefined aligning and bonding operations.

There has thus been shown and described a multilayered circuit board assembly wherein substantially greater wiring densities are possible on one side of the board while substantially lesser resistances (and corresponding greater current capacities) are possible on the other side. Such a structure facilitates circuit design while maintaining desired high densities as required in many of today's current designs as well as those expected in the future. These methods as defined herein enable individual testing of each individual subassembly prior to final incorporation within the composite structure, thus assuring cost savings over techniques wherein such testing was only possible in the final structure. Replacement and/or repair of individual subassemblies is thus possible prior to such final incorporation.

While there have been shown and described what are at present considered the preferred embodiments, it will be obvious to those skilled in the art that various changes and modifications may be made therein without departing from the scope of the invention as defined by the appended claims.

What is claimed is:

1. In a multilayered circuit board assembly including first, second and third layered subassemblies arranged in a serially contiguous manner, each of said subassemblies having at least one dielectric layer, electrically conducting wiring in the form of at least one conductive layer and at least one through hole therein, each of said subassemblies further including a predetermined wiring density and an electrical current resistance, the improvement wherein said wiring densities and said electrical current resistances of said subassemblies progressively decrease from said first subassembly to said third subassembly.

2. The improvement according to claim 1 further including a fourth layered subassembly located adjacent and contiguous to said third layered subassembly and possessing a wiring density and an electrical current resistance progressively less than said wiring density and said electrical current resistance of said third layered subassembly.

3. The improvement according to claim 1 wherein each of said layered subassemblies include a plurality of through holes therein, at least some of said through holes being in alignment.

4. The improvement according to claim 3 wherein at least some of said aligning through holes in said layered subassemblies are substantially similar in size.

5. The improvement according to claim 4 wherein said aligning through holes include a continuous conductive layer therein.

6. The improvement according to claim 3 wherein at least some of said aligning through holes in said layered subassemblies are progressively larger from said first layered subassembly to said third layered subassembly.

7. The improvement according to claim 6 wherein said aligning through holes of progressively larger size include a continuous conductive layer therein.

8. The improvement according to claim 7 further including a dielectric layer interconnecting said layered subassemblies and substantially surrounding the locations of intersection between said aligning through holes and said continuous conductive layers therein.

9. The improvement according to claim 3 wherein said aligning through holes each include an extending conductive end segment at the end of said through hole that aligns with a respective other through hole, said extending conductive end segments of each of said through holes being electrically connected.

10. The improvement according to claim 9 further including a common layer of conductive material located between and in contact with each of said aligned and electrically connected conductive end segments.

11. The improvement according to claim 10 wherein each of said conductive end segments is comprised of copper and said common layer of conductive material is comprised of tin.

12. The improvement according to claim 1 wherein the current capacities of said layered subassemblies increases from said first layered subassembly to said third layered subassembly.

13. The improvement according to claim 1 wherein the spacing of said conducting wiring of said layered subassemblies increases from said first layered subassembly to said third layered subassembly.

14. The improvement according to claim 1 wherein the thickness of said conducting wiring of said layered subassemblies increases from said first layered subassembly to said third layered subassembly.

15. The improvement according to claim 1 wherein the number of through holes in said layered subassemblies progressively decreases from said first layered subassembly to said third layered subassembly.

16. A method of making a multilayered circuit board assembly including at least three layered subassemblies, each of said layered subassemblies having at least one dielectric layer, electrically conducting wiring in the form of at least one conductive layer and at least one through hole therein, each of said layered subassemblies including a predetermined wiring density and electrical current resistance, said method comprising the steps of:
   aligning said three layered subassemblies in a serially contiguous manner;
   providing at least one common through hole through said first, second and third layered subassemblies;
   providing a layer of conductive material within said common through hole and extending through said first, second and third layered subassemblies; and
   bonding said three layered subassemblies together to form said multilayered circuit board assembly, said wiring densities and said electrical current resistances of said layered subassemblies progressively decreasing from said first layered subassembly to said third layered subassembly.

17. The method according to claim 16 further including aligning a fourth layered subassembly in contiguous manner with said third layered subassembly, extending said common through hole and said layer of conductive material within said common through hole through said fourth layered subassembly, and bonding said fourth layered subassembly to said third layered subassembly, said wiring density and said electrical current resistance of said fourth layered subassembly being progressively less than said wiring density and said electrical current resistance of said third layered subassembly.

18. A method of making a multilayered circuit board assembly including at least three layered subassemblies, each of said layered subassemblies having at least one dielectric layer, electrically conducting wiring in the form of at least one conductive layer and at least one through hole therein, each of said layered subassemblies including a predetermined wiring density and electrical current resistance, said method comprising the steps of:
   providing at least one through hole in each of said layered subassemblies;
   aligning said layered subassemblies having said though holes therein relative to one another such that said layered subassemblies are arranged in a serially contiguous manner and at least some of said through holes are aligned with one another;
   bonding said aligned layered subassemblies having said aligned through holes to form a multilayered structure; and
   providing a continuous conductive layer within each of said aligned through holes, said wiring densities and said electrical current resistances of said layered subassemblies progressively decreasing from said first layered subassembly to said third layered subassembly.

19. The method according to claim 18 further including the step of providing a quantity of dielectric adhesive material between said layered subassemblies prior to said bonding thereof.

20. The method according to claim 19 further including the step of removing selected quantities of said dielectric adhesive material from between said layered subassemblies subsequent to said bonding, said selected quantities being removed located substantially within said aligned through holes.

21. The method according to claim 20 wherein said removal of said dielectric adhesive material is achieved using laser ablation.

* * * * *